United States Patent [19]
Okuda et al.

[11] Patent Number: 6,081,040
[45] Date of Patent: Jun. 27, 2000

[54] SEMICONDUCTOR DEVICE HAVING ALIGNMENT MARK

[75] Inventors: Shoichi Okuda, Gamagori; Mitsuhiro Saitou, Ohbu; Hiroyuki Ban, Hazu-gun, all of Japan

[73] Assignee: Denso Corporation, Kariya, Japan

[21] Appl. No.: 09/039,340

[22] Filed: Mar. 16, 1998

[30] Foreign Application Priority Data

Mar. 17, 1997 [JP] Japan .................................. 9-063245

[51] Int. Cl.⁷ .................................................. H01L 21/465
[52] U.S. Cl. ........................................... 257/797; 257/798
[58] Field of Search ..................................... 257/797, 798

[56] References Cited

U.S. PATENT DOCUMENTS

| 4,369,557 | 1/1983 | Vandebult . |
| 4,642,672 | 2/1987 | Kitakata . |
| 5,266,529 | 11/1993 | Lau et al. . |

FOREIGN PATENT DOCUMENTS

| 60-171756 | 9/1985 | Japan . |
| 1-297838 | 11/1989 | Japan . |
| 2-130802 | 5/1990 | Japan . |
| 2-147182 | 6/1990 | Japan . |
| 2-138434U | 11/1990 | Japan . |
| 5-129177 | 5/1993 | Japan . |
| 6-045437 | 2/1994 | Japan . |
| 8-264423 | 10/1996 | Japan . |

OTHER PUBLICATIONS

*IBM Tech Discl Bul,* vol. 32 No. 9b, pp. 74–75, 1990.

*Primary Examiner*—Stephen D. Meier
*Attorney, Agent, or Firm*—Pillsbury Madison & Sutro, LLP

[57] ABSTRACT

An alignment mark for determining a position of a thin film resistor formed on a semiconductor chip. The alignment mark is disposed on a capacitor formation region of the semiconductor chip. Because aluminum wiring members of the semiconductor chip are not disposed adjacent to the alignment mark within the capacitor formation region, the alignment mark can be precisely recognized. As a result, the position of the thin film resistor can be also precisely determined.

30 Claims, 4 Drawing Sheets

6,081,040

SEMICONDUCTOR DEVICE HAVING ALIGNMENT MARK

CROSS REFERENCE TO RELATED APPLICATION

This application is based upon and claims the benefit of priority of the prior Japanese Patent Application No. 9-63245 filed on Mar. 17, 1997, the contents of which are incorporated herein by reference.

BACKGROUND OF THE INVENTION

1. Field of the Invention

The present invention relates to a semiconductor device having a thin film resistor and an alignment mark for determining a trimming position of the thin film resistor.

2. Related Arts

When several semiconductor chips having thin film resistors are provided on a wafer, values of resistance of the thin film resistors are adjusted by laser trimming. In this case, it is necessary to determine precise positions (trimming positions) of the thin film resistors on which the laser trimming is to be performed. Conventionally, as shown in FIG. 9, semiconductor chips 22 are divided by scribe lines 20, and an alignment mark 21 having a cross shape and made of aluminum (Al) is formed on one of intersections of the scribe lines 20 to determine the trimming positions. In more detail, a laser beam is scanned on the alignment mark 21 in X and Y directions, and an absolute position of the alignment mark 21 is recognized based on the contrast of the beam reflected from the alignment mark 21. The trimming positions of the thin film resistors are determined relatively to the absolute position of the alignment mark 21. Then, the laser trimming is performed on the trimming positions using a trimming apparatus.

However, because each width of the scribe lines 20 is very small, there arises a possibility that wiring patterns 22a made of Al and formed on outer circumferential portions of the semiconductor chips 22 are erroneously recognized as the alignment mark 21. As an example, waveforms of the beam reflected from the alignment mark 21 and the wiring patterns 22a are shown in FIG. 10. The waveform corresponding to the alignment mark 21 is not largely different from the waveforms corresponding to the wiring patterns 22a. Therefore, one of the Al wiring patterns 22a may be recognized as the alignment mark 21.

In addition, conventionally, regions other than the scribe lines 20 are covered with a protection layer and a heat treatment is performed on the wafer. Accordingly, the surface of the alignment mark 21 is roughened, resulting in increase in noise of the beam reflected from the alignment mark 21. This also makes difficult to precisely detect the position of the alignment mark 21.

SUMMARY OF THE INVENTION

The present invention has been made in view of the above-mentioned problems and an object of the present invention is to provide a semiconductor device having an alignment mark capable of being precisely recognized for determining a relative position on the semiconductor chip.

According to the present invention, an alignment mark for determining a position of a thin film resistor is disposed on a capacitor. Because the capacitor has an area sufficient for including the alignment mark therein, the alignment mark can be arranged apart from a member such as an Al wiring member capable of being erroneously recognized as the alignment mark. As a result, the position of the alignment mark can be precisely detected by scanning a beam.

Preferably, an insulation layer is disposed between the capacitor and the alignment mark. The alignment mark can be covered with a protection layer to improve contrast of a beam reflected from the alignment mark.

BRIEF DESCRIPTION OF THE DRAWINGS

These and other objects and features of the present invention will become more readily apparent from a better understanding of a preferred embodiment described below with reference to the following drawings.

DETAILED DESCRIPTION OF THE PREFERRED EMBODIMENT

Figure 1:
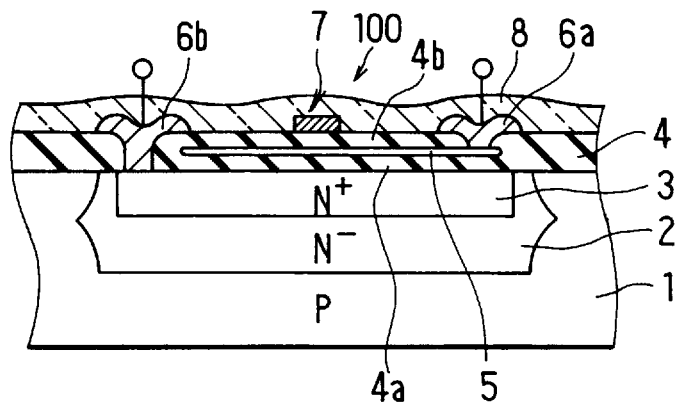
FIG. 1 is a cross-sectional view showing a semiconductor chip at a capacitor formation region in a preferred embodiment of the present invention.

In a preferred embodiment of the present invention, several semiconductor chips are formed on a wafer, and each of the semiconductor chips has an alignment mark on a region where a capacitor are provided (herebelow referred to as a capacitor formation region). Referring to FIG. 1, at a capacitor formation region 100 of one of the semiconductor chips, an $N^-$ well region 2 is formed in a P-type semiconductor substrate 1, and an $N^+$ region 3, which serves as one of electrodes for the capacitor, is formed in the $N^-$ well region 2. An insulation layer 4a made of silicon oxide ($SiO_2$) is disposed on the semiconductor substrate 1, and a poly-silicon layer 5, which serves as the other of the electrodes for the capacitor, is disposed on the insulation layer 4a. Further, an intermediate insulation layer 4b is disposed on the poly-silicon layer 5.

The intermediate insulation layer 4 has openings exposing the poly-silicon layer 5 and the $N^+$ region 3. In the openings, Al wiring members 6a and 6b are respectively disposed to make contact with the poly-silicon layer 5 and the $N^+$ region 3. The capacitor is formed by the insulation layer 4a disposed between the $N^+$ region 3 and the poly-silicon layer 5. Then, an alignment mark 7 made of Al is disposed on the intermediate insulation layer 4b. An entire surface of the capacitor formation region 100 is covered with a protection layer 8.

Figure 2:
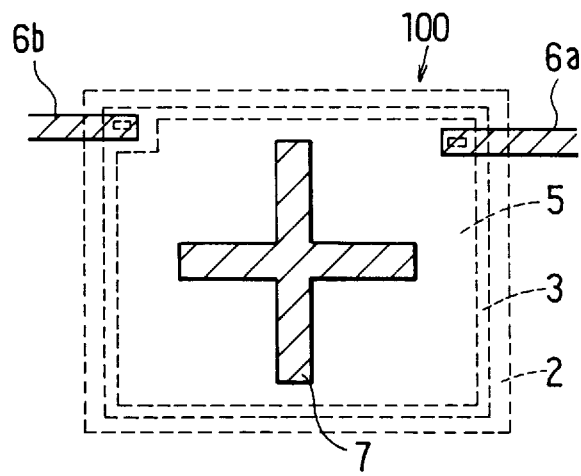
FIG. 2 is a plan view schematically showing an alignment mark and the capacitor formation region of FIG. 1.
Figure 3:
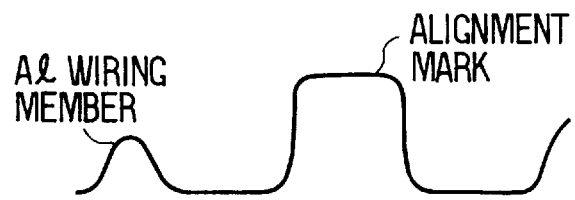
FIG. 3 is a schematic view showing waveforms of a beam reflected from the alignment mark and Al wiring members provided in the semiconductor chip.

In more detail, the alignment mark 7 has a cross shape disposed within a region where the poly-silicon layer 5 is formed on a plan view shown in FIG. 2. The poly-silicon layer 5 is formed within the capacitor formation region 100. The capacitor formation region 100 usually has a relatively large area. Therefore, the alignment mark 7 can be disposed at a position apart from the Al wiring members 6a and 6b and other Al wiring members disposed in the semiconductor chip. When the alignment mark 7 is scanned with a laser beam in X and Y directions, as show in FIG. 3, contrast of the beam reflected from the semiconductor chip becomes prominent where the alignment mark 7 exists, so that the position of the alignment mark 7 is accurately detected. The Al wiring members do not disturb the detection of the position of the alignment mark 7. In addition, because the alignment mark 7 is covered with the protection layer 8, the surface on the alignment mark 7 is smoothed, resulting in decrease in noise and improvement of the contrast of the beam reflected from the alignment mark 7.

Figure 4:
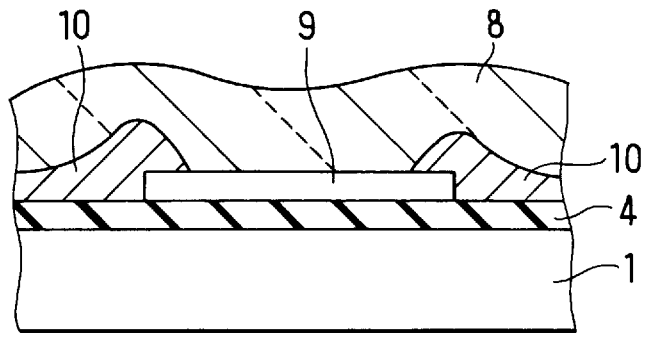
FIG. 4 is a cross-sectional view showing a thin film resistor of the semiconductor chip.

By detecting the position of the alignment mark 7, an assumed origin of the X and Y directions is determined. A position of a thin film resistor is supposed based on the assumed origin, and then laser trimming is performed on the thin film resistor. In this embodiment, the assumed origin corresponds to an intersection of the cross shape of the alignment mark 7. Therefore, the accurate detection of the alignment mark 7 results in a precise performance of the laser trimming to the thin film resistor. Referring to FIG. 4, the thin film resistor, which is indicated with reference numeral 9, is formed on the insulation layer 4 made of $SiO_2$, and Al wiring members 10 are disposed on both ends of the thin film resistor 9.

Figure 5A:
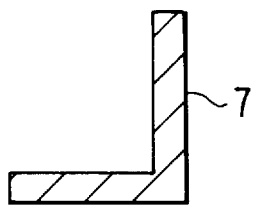
FIGS. 5A and 5B are plan views schematically showing other shapes of the alignment mark of the present invention.
Figure 5B:
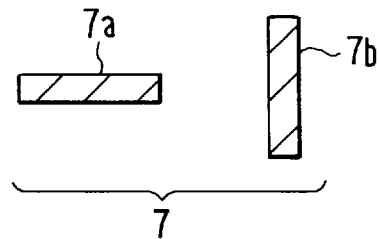
Figure 7:
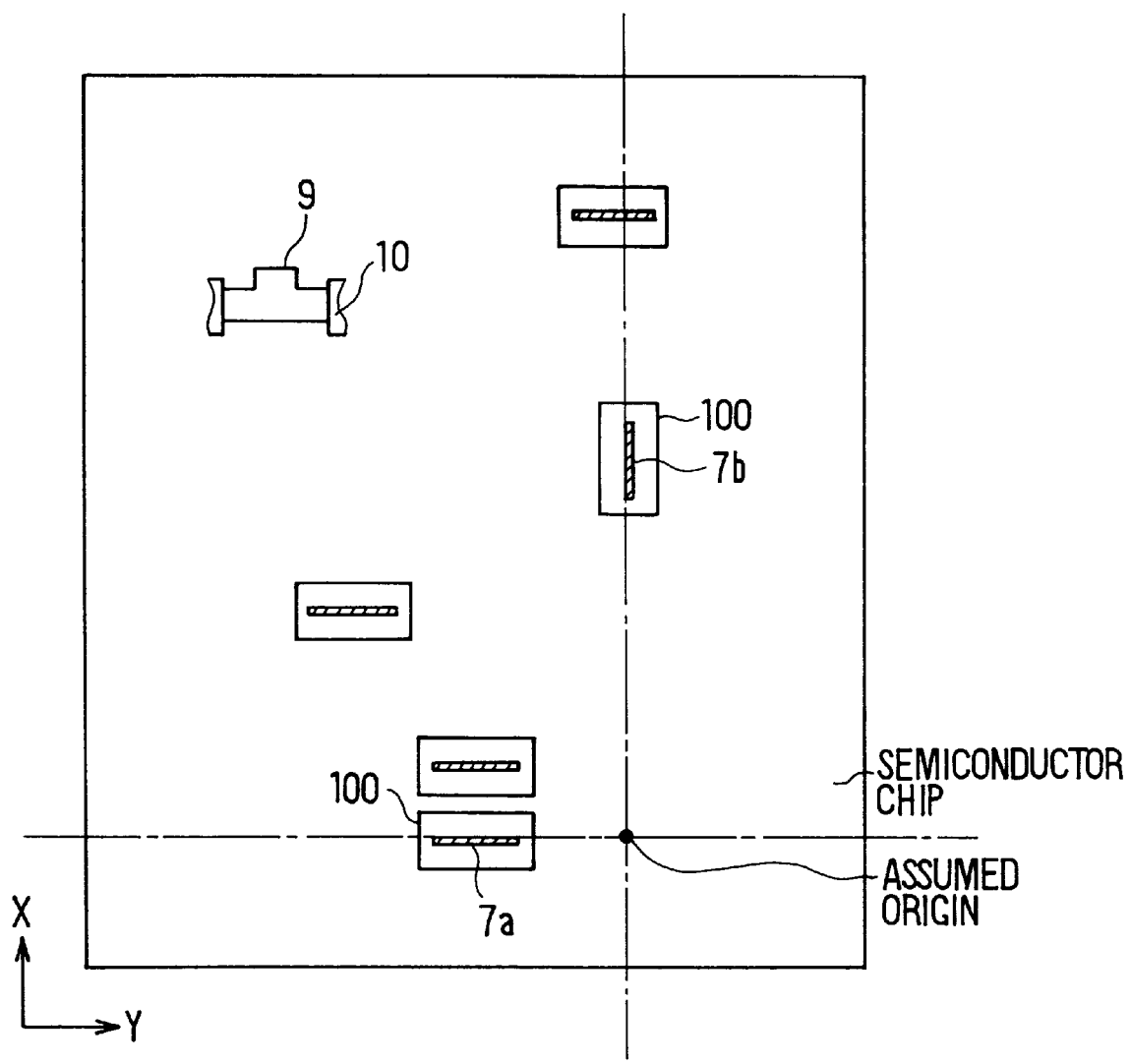
FIG. 7 is a plan view showing the semiconductor chip to which the alignment marks shown in FIG. 5B are adopted.

Although the alignment mark 7 has the cross-shape in this embodiment, the alignment mark 7 may have an L shape as shown in FIG. 5A, or be composed of two alignment marks 7a and 7b which are perpendicular to each other as shown in FIG. 5B. In such a case, the alignment marks 7a and 7b may be formed on the same capacitor together or on difference capacitors respectively as shown in FIG. 7. In FIG. 7, an intersection of extended lines of the alignment marks 7a and 7b is detected as the assumed origin. The alignment marks may be formed not only on the capacitor formation regions but also on other regions apart from the Al wiring members.

Figure 8:
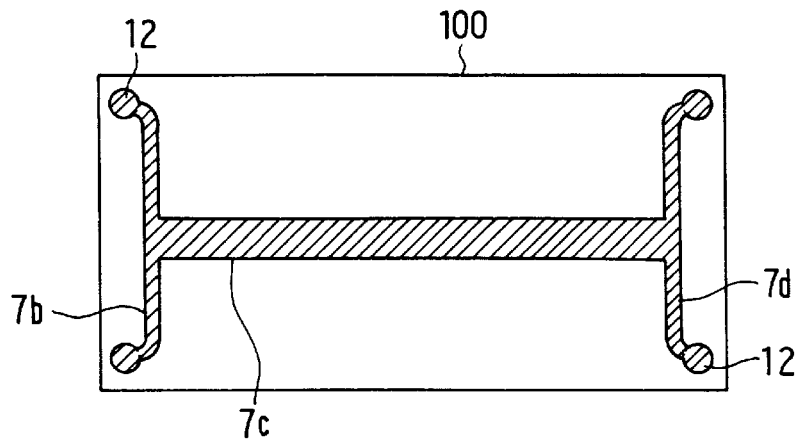
FIG. 8 is a plan view showing an alignment mark in another modified embodiment.
Figure 9:
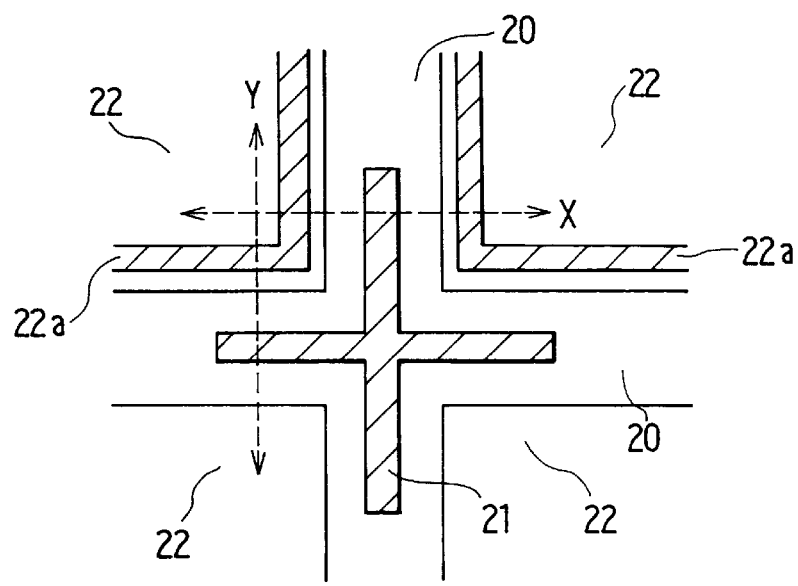
FIG. 9 is a plan view showing an alignment mark formed on a scribe line of a wafer in a prior art.
Figure 10:
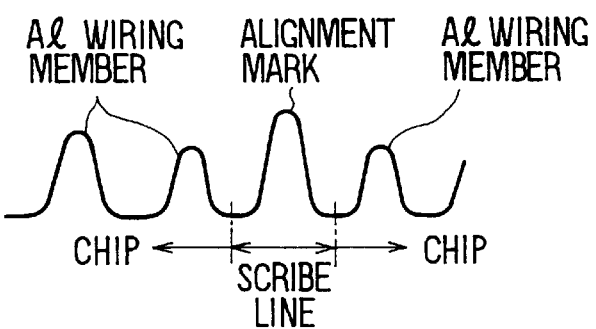
FIG. 10 is a schematic view showing waveforms of a beam reflected from the alignment mark of FIG. 9.

In this embodiment, the alignment mark 7 is electrically independent from the electrodes of the capacitor. However, the alignment mark 7 may electrically communicate with one of the electrodes of the capacitor as shown in FIG. 8. In FIG. 8, reference numeral 12 indicates contact holes exposing the electrode of the capacitor and reference numeral 7c indicates a scanning pattern on which a laser beam is scanned. Reference numeral 7d indicates contact patterns for electrically connecting the scanning pattern 7c and the electrode through the contact holes 12. The alignment mark 7 is composed of the scanning pattern 7c and the contact patterns 7d. In this case, the alignment mark 7 is prevented from providing capacity to the intermediate insulation layer 4b in cooperation with the upper electrode (the poly-silicon layer 5), so that variations in capacity of the capacitor can be prevented. The contact patterns 7d need to be arranged not to cause erroneous recognition of the scanning pattern 7c. In FIG. 8, the scanning pattern 7c and the contact patterns 7d generally form an H-like shape. This arrangement is also effective to make distribution of electric potential of the alignment mark 7 uniform. However, it is apparent that the arrangement of the scanning pattern 7c and the contact patterns 7d is not limited to the H-like shape as shown in FIG. 8. The alignment mark 7 may be connected to the electrode of the capacitor only at one portion.

Figure 6:
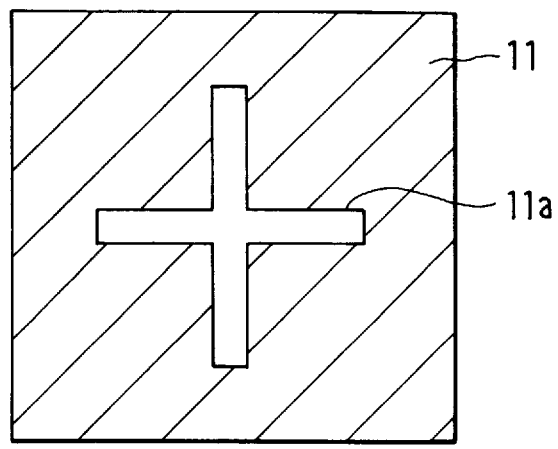
FIG. 6 is a plan view schematically showing an alignment mark in a modified embodiment of the present invention.

The alignment mark 7 is made of Al. However, as shown in FIG. 6, a hollow portion formed in an Al pad 11 can serve as an alignment mark 11a in place of the alignment mark 7. In this case, it is necessary that the pad 11 has an area sufficient for providing the alignment mark 11 therein. The alignment mark 11a may be formed in an Al wiring member in place of the Al pad 11.

In the above-mentioned embodiment, adjacent semiconductor elements on the substrate are isolated from each other through a semiconductor region having the same type as the substrate. This is so-called PN junction isolation. However, the adjacent semiconductor elements may be isolated from each other through an insulating portion, i.e., in the so-called trench isolation structure. The substrate may be an SOI (Silicon On Insulator) substrate.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A semiconductor chip comprising:
   a substrate;
   a thin film resistor disposed on the substrate;
   a capacitor disposed on the substrate; and
   an alignment mark disposed above the capacitor for determining a relative position of the thin film resistor based on a position of the alignment mark, the alignment mark having a flat surface and made of a material different from a portion in a vicinity surrounding the alignment mark to have a reflectance different from a reflectance of said portion of said vicinity.

2. The semiconductor chip of claim 1, further comprising a first insulation layer disposed between the capacitor and the alignment mark.

3. The semiconductor chip of claim 2, wherein the capacitor has a first electrode underlying the first insulation layer, a second insulation layer underlying the first electrode, and a second electrode underlying the second insulation layer.

4. The semiconductor chip of claim 3, wherein the first electrode of the capacitor is made of poly-silicon.

5. The semiconductor chip of claim 4, wherein
   the alignment mark is made of a metallic material; and
   the first insulation layer disposed on the first electrode is exposed on the portion of said vicinity.

6. The semiconductor chip of claim 5, wherein
   the alignment mark has a main portion extending in a specific direction and a contact pattern portion connected to the main portion and extending in a direction different from the specific direction, the main portion being electrically connected to the first electrode of the capacitor through a hole defined in the first insulation layer and the contact pattern.

7. The semiconductor chip of claim 3, wherein the alignment mark is electrically connected to the first electrode of the capacitor.

8. The semiconductor chip of claim 1, further comprising a protection layer disposed on the alignment mark.

9. The semiconductor chip of claim 1, wherein the alignment mark has a cross shape.

10. The semiconductor chip of claim 1, wherein:
   the capacitor includes first and second capacitors;
   the alignment mark includes first and second alignment marks respectively disposed on the first and second capacitors to be perpendicular to each other.

11. The semiconductor chip of claim 10, wherein an intersection of extended lines of the first and second alignment marks is an assumed origin for relatively determining the position of the thin film resistor.

12. A semiconductor chip comprising;

a substrate;

a capacitor disposed on the substrate with a capacitor area, the capacitor including first and second electrodes and a first insulation layer disposed between the first and second electrodes;

a second insulation layer disposed on the capacitor; and an alignment mark disposed on the capacitor through the second insulation layer within the capacitor area for determining a relative position on the substrate based on a position of the alignment mark.

13. The semiconductor chip of claim 12, wherein the alignment mark has a cross shape.

14. The semiconductor chip of claim 12, wherein:

the capacitor has first and second capacitors;

the alignment mark has first and second alignment marks respectively disposed on the first and second capacitors to be perpendicular to each other; and the relative position on the substrate is determined based on an intersection of extended lines of the first and second alignment marks.

15. The semiconductor chip of claim 14, wherein the alignment mark electrically communicates with one of the first and second electrodes of the capacitor.

16. The semiconductor chip of claim 12, wherein the alignment mark has a main portion extending in a specific direction for determining the relative position on the substrate, and a contact pattern portion electrically connected to the main portion and extending in a direction different from the specific direction, the contact pattern portion being electrically connected to one of the first and second electrodes of the capacitor through a hole defined in the second insulation layer.

17. The semiconductor chip of claim 16, wherein the contact pattern portion includes first and second contact pattern portions respectively provided on first and second ends of the main portion and extending in the direction approximately perpendicular to the specific direction; and the first and second contact pattern portions are electrically connected to the one of the first and second electrodes of the capacitor through first and second holes defined in the second insulation layer, respectively.

18. The semiconductor chip of claim 16, wherein the contact pattern portion has a width smaller than that of the main portion.

19. A semiconductor device including several semiconductor chips, wherein one of the semiconductor chips includes a thin film resistor and an alignment mark for determining a position of the thin film resistor to which trimming is to be performed.

20. A semiconductor chip comprising:

a substrate;

a capacitor disposed on the substrate and having an upper electrode made of polysilicon; and an alignment mark disposed above the upper electrode of the capacitor for relatively determining a specific position on the substrate based on a position of the alignment mark, the alignment mark being made of a metallic material.

21. The semiconductor chip of claim 20, wherein an area of the upper electrode is larger than an area of the alignment mark so that a portion in a vicinity surrounding the alignment mark is provided above the upper electrode.

22. The semiconductor chip of claim 21, wherein the alignment mark has a reflectance different from a reflectance of the portion of said vicinity.

23. The semiconductor chip of claim 20, wherein the capacitor has a first insulation layer underlying the upper electrode and a lower electrode underlying the insulation layer.

24. The semiconductor chip of claim 20, further comprising a second insulation layer interposed between the upper electrode and the alignment mark.

25. The semiconductor chip of claim 20, wherein the capacitor includes first and second capacitors provided on the substrate to be separated from each other; and the alignment mark includes first and second alignment marks respectively provided above the first and second capacitors, the first and second alignment marks extend in first and second directions perpendicular to each other, thereby providing an assumed origin for determining the specific position on the substrate.

26. A semiconductor chip comprising:

a substrate;

a plurality of elements provided on the substrate and having areas different from one another; and an alignment mark disposed above one of the plurality of elements to overlap with a conductive member of the one of the plurality of elements, the one of the plurality of element having an area larger than an area of the alignment mark.

27. A semiconductor chip of claim 26, wherein the conductive member has an area larger than the area of the alignment mark.

28. A semiconductor chip of claim 26 wherein the conductive member is made of polysilicon; and the alignment mark is made of a metallic material.

29. A semiconductor chip of claim 26, wherein the alignment mark includes first and second alignment marks respectively provided above first one and second one of the plurality of elements which are separated from each other on the substrate, the first alignment mark being extending in a direction perpendicular to a direction in which the second alignment mark extends, thereby providing an assumed origin for determining a specific position on the substrate.

30. A semiconductor chip of claim 26, wherein the plurality of elements is a capacitor.

* * * * *